(12) United States Patent
Norström

(10) Patent No.: US 6,333,216 B1
(45) Date of Patent: Dec. 25, 2001

(54) METHOD IN THE MANUFACTURING OF A SEMICONDUCTOR DEVICE

(75) Inventor: Hans Norström, Solna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/531,179

(22) Filed: Mar. 21, 2000

Related U.S. Application Data

(62) Division of application No. 09/080,955, filed on May 19, 1998, now Pat. No. 6,077,752, which is a continuation of application No. PCT/SE96/01511, filed on Nov. 20, 1996.

(30) Foreign Application Priority Data

Nov. 20, 1995 (SE) .................................... 9504150

(51) Int. Cl.⁷ .................................... H01L 21/336
(52) U.S. Cl. ................... 438/197; 438/309; 438/202; 438/205; 438/207
(58) Field of Search .................. 438/309, 155, 438/197, 318, 378, 260, 162, 166, 487, 308, 184, 200, 201, 202, 205, 207

(56) References Cited

U.S. PATENT DOCUMENTS

| | | | |
|---|---|---|---|
| 4,460,417 | * 7/1984 | Murase et al. .................. 148/187 |
| 4,693,782 | 9/1987 | Kikuchi et al. . | |
| 4,792,501 | 12/1988 | Allred et al. . | |
| 4,960,719 | 10/1990 | Tanaka et al. . | |
| 4,988,632 | 1/1991 | Pfiester . | |
| 5,025,741 | * 6/1991 | Suwanai et al. . | |
| 5,194,926 | 3/1993 | Hayden . | |
| 5,213,988 | 5/1993 | Yamauchi et al. . | |
| 5,213,989 | * 5/1993 | Fitch et al. . | |
| 5,227,329 | * 7/1993 | Kobayashi et al. ............. 437/101 |
| 5,266,504 | 11/1993 | Blouse et al. . | |
| 5,484,737 | 1/1996 | Ryun et al. . | |
| 5,530,265 | * 6/1996 | Takemura ......................... 257/66 |
| 5,606,179 | * 2/1997 | Yamazaki et al. ................ 257/59 |
| 5,674,777 | * 10/1997 | Chen et al. ..................... 437/101 |
| 5,773,329 | * 6/1998 | Kuo ............................... 438/162 |
| 5,869,362 | * 2/1999 | Ohtani ............................ 438/166 |
| 5,966,596 | * 10/1999 | Ohtani et al. .................. 438/155 |
| 6,136,652 | * 10/2000 | Hazani ........................... 438/260 |

FOREIGN PATENT DOCUMENTS

| | | |
|---|---|---|
| 0 573 823 | 12/1993 | (EP) . |
| 000 573 823-A2 | * 12/1993 | (EP) ..................... H01L/21/336 |

OTHER PUBLICATIONS

S.J. Jeng et al, "Structure, properties, and thermal stability of in situ phosphorus–doped hydrogenated microcrystalline silicon prepared by plasma–enhanced chemical vapor deposition," *Appl. Phys. Lett*, vol. 58, No. 15, Apr. 1991, pp. 1632–1634.

T.H. Ning et al, "Self–Aligned NPN Bipolar Transistors," IDEM Technical Digest/International Electron Devices Meeting, 1980, pp. 823–824.

International Search Report for International Application No. PCT/SE96/01511.

* cited by examiner

*Primary Examiner*—Matthew Smith
*Assistant Examiner*—V. Yevsikov
(74) *Attorney, Agent, or Firm*—Burns, Doane, Swecker & Mathis, L.L.P.

(57) ABSTRACT

A selective etching method in the fabrication of a semiconductor device is provided. The method involves the steps of: depositing an amorphous layer of semiconductor material on a monocrystalline substrate of the same semiconductor material; depositing at least one dielectric layer on the amorphous layer such as to prevent crystallization of said amorphous layer; patterning the resultant structure and thereafter etching away the dielectric layer and the amorphous semiconductor layer within a predetermined area or region; and heat-treating the resulting structure.

7 Claims, 2 Drawing Sheets

METHOD IN THE MANUFACTURING OF A SEMICONDUCTOR DEVICE

CROSS-REFERENCE TO RELATED APPLICATIONS

This application is a divisional of U.S. application Ser. No. 09/080,955, filed May 19, 1998, now U.S. Pat. No. 6,077,752 which is a continuation of International Application No. PCT/SE96/01511, filed Nov. 20, 1996.

FIELD OF INVENTION

The present invention relates to a method of etching selectively when manufacturing semiconductor devices and to a method of manufacturing bipolar transistors while applying the selective etching method.

DESCRIPTION OF THE PRIOR ART

The trend in the design and manufacture of integrated circuits leans towards progressively smaller individual components of progressively higher performances. For instance, the dimensions of bipolar transistors are becoming progressively smaller, both horizontally and vertically, so as to increase packing densities and transistor speeds. Manufacturing precision has therewith become progressively more important, both with regard to individual process stages and with regard to the alignment between different layers.

There is normally used at present in the manufacture of bipolar high frequency transistors a technique that employs a self-registered base-emitter structure (T. H. Ning et al, "Self-Aligned npn Bipolar Transistors", IEDM Techn. Dig., pages 823–824, 1980), which enables the transistor cell to be made smaller while obtaining a reduced base-collector capacitance and a reduced base resistance when the extrinsic base is connected to the intrinsic base in the immediate proximity of the emitter. Several variants of this method are known to the art.

U.S. Pat. No. 5,266,504 describes a method of manufacturing a self-registered bipolar transistor in which the base is grown epitaxially and the emitter is formed by the deposition of an amorphous silicon layer followed by a polycrystalline silicon layer, whereafter the structure is patterned and etched. The amorphous silicon layer is then recrystallized by SPE (Solid Phase Epitaxy). This method is able to provide a thin base and a sharp and well-controlled emitter-base junction.

U.S. Pat. No. 4,988,632 teaches the deposition of a polycrystalline silicon layer or an amorphous silicon layer on a substrate and doping of the layer. A layer of LTO (Low Temperature Oxide) or some other dielectric is deposited on said silicon layer, whereafter the structure is patterned and etched to provide a base electrode and emitter opening. U.S. Pat. No. 5,213,989 teaches a method of depositing a polycrystalline silicon layer, an amorphous silicon layer or some similar silicon-based layer on a substrate and doping said layer, whereafter a dielectric layer, preferably a TEOS-based (Tetra Ethyl Ortho Silicate-based) oxide is deposited over the silicon layer. The structure is patterned and etched in a known manner. It is not evident from U.S. Pat. Nos. 4,988,632 and 5,213,989 that the silicon layers shall be amorphous when etching out the emitter openings.

Those problems that occur when selectively etching away a polycrystalline silicon layer from a silicon substrate involve difficulties in stopping the etching process so that the polycrystalline silicon layer is removed completely without penetrating the substrate too deeply. The polycrystalline silicon layer is also etched at different speeds along different crystal directions and at grain boundaries, resulting in etching residues, so-called pillars, or in irregularities in the etched surface, so-called facets, and in blunt or dull edges in the etched openings. When the polycrystalline layer is to be doped by ion implantation, there is a risk of channelization of the dopant in grain boundaries or along crystal directions, meaning that the degree of doping cannot be controlled. Particularly when etching out the emitter opening in the manufacture of bipolar transistors that have a self-registered base-emitter structure, it is of the greatest importance that the aforesaid problems are overcome, since when the substrate is etched too deeply there is a risk of obtaining an excessively high series resistance or no electrical contact at all between intrinsic and extrinsic base. When doping to achieve a given type of doping, n or p, to form the emitter, there is also the risk of forming so-called pipes, i.e. channels of said doping type transversely through the intrinsic base, resulting in emitter leakage. These pipes are formed generally as a result of etching residues, so-called pillars.

SUMMARY OF THE INVENTION

The object of the present invention is to resolve the aforesaid problems and thus produce semiconductor components, particularly bipolar transistors, of higher quality and/or higher performance and/or of smaller size than those semiconductor components produced by hitherto known methods.

To this end, the inventive method includes the etching of amorphous silicon. Such silicon lacks crystal structures. The use of amorphous silicon thus removes many of the problems and drawbacks encountered when etching polycrystalline silicon.

The inventive method involves depositing an amorphous silicon layer on a crystalline silicon substrate. According to the invention, there is deposited on the amorphous silicon layer a protective dielectric layer such as to prevent crystallization of the amorphous layer. The dielectric layer is preferably deposited by one of the following methods: PECVD (Plasma Enhanced Chemical Vapor Deposition), SACVD (Sub Atmospheric Chemical Vapor Deposition), MBE (Molecular Beam Epitaxy) or with the aid of a spin-on technique: The dielectric layer is preferably comprised of PETEOS (Plasma Enhanced Tetra Ethyl Ortho Silicate). The resultant structure is patterned, whereafter the dielectric layer and the amorphous silicon layer are etched, for instance dry-etched, within a predetermined area.

The inventive etching method provides structures which have sharply defined edges and smooth pronounced etched surfaces in the absence of pillar or facet formation tendencies. Good etching selectivity between amorphous and crystalline silicon is also obtained. This results in semiconductor components of improved performance in relation to earlier semiconductor components. Particularly when fabricating a bipolar transistor having a self-registered base-emitter structure, the aforesaid etching process can be applied when etching-away the emitter opening in a manner which enables semiconductor devices of very small dimensions (length scales in the sub-micrometer range) to be produced. The advantages afforded by the present method include good etching selectivity when etching amorphous silicon on crystalline silicon, good CD control (Critical Dimension control), i.e. good control of the dimensions of the etched opening, and the avoidance of the risk of channelization of the dopant in the case of ion implantation processes.

BRIEF DESCRIPTION OF THE DRAWINGS

The invention will now be described in more detail with reference to the accompanying drawings, in which.

DESCRIPTION OF PREFERRED EMBODIMENTS

Figure 1:
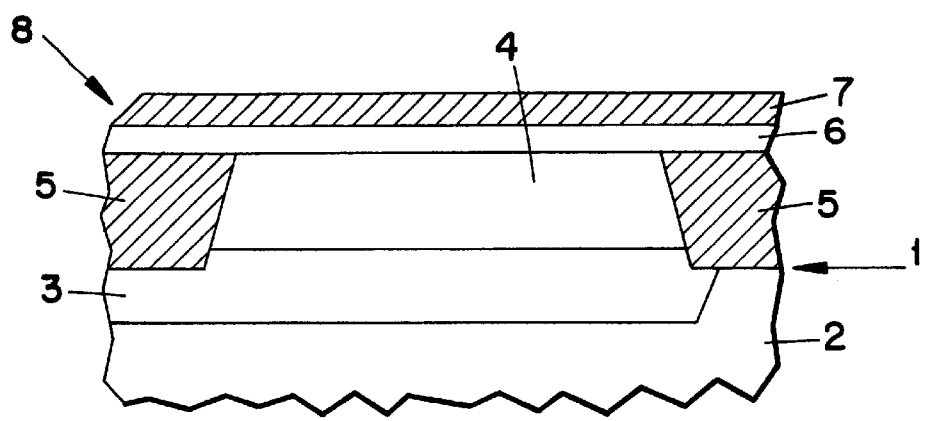
FIGS. 1–2 are cross-sectional views which illustrate two inventive method steps when etching a silicon layer on a silicon surface.

Shown in FIG. 1 is a silicon substrate 1, wherein the silicon may be a monocrystalline, a polycrystalline or a microcrystalline silicon, but which is preferably a monocrystalline silicon. As in the FIG. 1 illustration, the substrate 1 may have various defined active regions 2–5, which will be described below in more detail, although the substrate may also be homogenous. Any surface oxide present on the substrate 1, said surface oxide possibly having a thickness of some tens of Ångstroms, can be removed by conveniently dipping the substrate in an HF bath or in HF vapour. In accordance with the invention, there is deposited on the substrate 1 a layer 6 of amorphous silicon, so-called α-Si to a thickness of some hundred nanometers, preferably with the aid of CVD technique (Chemical Vapor Deposition) at 550–560° C. The amorphous silicon may alternatively be deposited at another temperature and/or with the aid of some other technique, such as PECVD or sputtering. In accordance with the invention, there is deposited on the amorphous silicon layer 6 a protective dielectric layer 7 such as to prevent crystallization of the amorphous layer 6. This is ensured when the dielectric layer 7 is deposited at a temperature below about 500° C. and over a relatively short period of time. The so-called single wafer technique is preferably used in this regard, i.e. a technique in which one wafer is processed at a time, which gives shorter deposition times. Examples of such techniques are PECVD, SACVD, MBE and the spin-on technique. The dielectric layer 7 may be comprised of a nitride or an oxide for instance, although it will preferably comprise a silicate. The silicate used will conveniently be PETEOS, i.e. TEOS (Tetra Ethyl Ortho Silicate), which is deposited with PECVD. This results in a high quality layer of low particle density and porosity, and also affords good control over layer thickness. The layer 7 shall be deposited to a thickness in the order of some hundred nanometers. A preferred deposition temperature is between 250 and 400° C. Although not shown, one or more additional dielectric layers may be deposited on the structure.

The structure, referenced 8 in FIG. 1, is then patterned with the aid of a conventional photolithographic process, whereafter the mutually superimposed additional dielectric layer (not shown) when present, the dielectric layer 7 and the amorphous silicon layer 6 are removed within a predetermined region or area 9 in an etching step. The upper side of the substrate 1 is thus exposed within the region 9. The dielectric layer 7 may be etched with the aid of an anisotropic dry etching process, for instance with the aid of $CHF_3/O_2$ plasma or $C_2F_6$ plasma. According to the present invention, the amorphous silicon layer 6 is preferably etched in a dry etching process, which may be anisotropic, e.g. an HBr and/or $Cl_2$ plasma.

The amorphous silicon, which lacks macroscopic crystal structures, is rich in defects and therefore has greater free energy than polycrystalline and monocrystalline silicon. It is therefore possible to achieve etching selectivity between amorphous silicon and polycrystalline or monocrystalline silicon. The greatest selectivity is obtained with monocrystalline silicon. In this case, it is possible to over-etch such as to positively etch away all amorphous silicon without penetrating the substrate too deeply. When etching amorphous silicon, no undesirable etching is obtained along grain boundaries or crystal surfaces, therewith resulting in smooth etched surfaces. When over-etching into the underlying monocrystalline silicon, a smooth surface is obtained in the absence of replica or facets of the grain structure, so-called reproduction of facet crystal grains or residual crystal grains, so-called pillars, as would possibly be the case when etching polycrystalline or microcrystalline silicon. Furthermore, an opening that is etched out in amorphous silicon will have sharper edges and smoother side walls than a corresponding opening that is etched-out in polycrystalline silicon. It is highly important to achieve good CD control, i.e. control over the dimensions of the etched opening, particularly when fabricating semiconductor devices within the sub-$\mu$m range, such control being achieved when etching in amorphous silicon.

The amorphous silicon layer 6 may optionally be doped prior to depositing the protective dielectric layer 7, said doping conveniently being effected by ion implantation. Ion implantation in amorphous silicon avoids channelization of the dopant in grain boundaries and crystal directions, such channelization normally occurring when ion implanting in crystalline silicon. When the layer 6 is doped p+, there is used the gas $BF_3$, which is ionized and accelerated, wherein desired ions are sorted out and allowed to penetrate into the silicon. The gas used is preferably $BF_2^+$ because this ion is produced in large quantities in the ionization process and boron will diffuse to a shallower depth in the substrate in a possible later heat-treatment process. Incorporation of fluorine in the amorphous silicon layer 6 can also contribute towards enabling the natural oxide boundary layer between the amorphous silicon layer 6 and the underlying substrate 1 to be broken-up more easily in a possible later heat-treatment process.

One of the aforedescribed methods can be used conveniently in the fabrication of diodes, metal semiconductor devices, transistors or other types of semiconductor components which include at least one etching step of silicon on silicon.

According to the present invention, the aforedescribed method steps are used as a sub-process in the fabrication of an npn-type bipolar transistor having a self-registered base-emitter structure, for instance.

Figure 2:
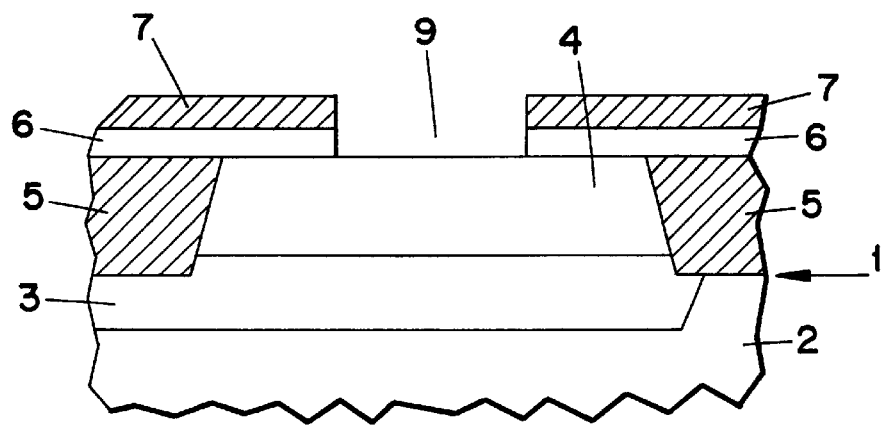

The method of fabricating a bipolar transistor departs from the structure illustrated in FIG. 2 having defined active regions 2, i.e. as seen from the bottom a p-doped region 2, an $n^+$-doped layer 3 for a collector electrode, and nearest the surface an n-doped layer 4, which is surrounded by an electrically insulating region 5.

The window 9 shown in FIG. 2 will form an emitter opening, whereas the amorphous silicon layer 6 will form an extrinsic base.

Figure 3:
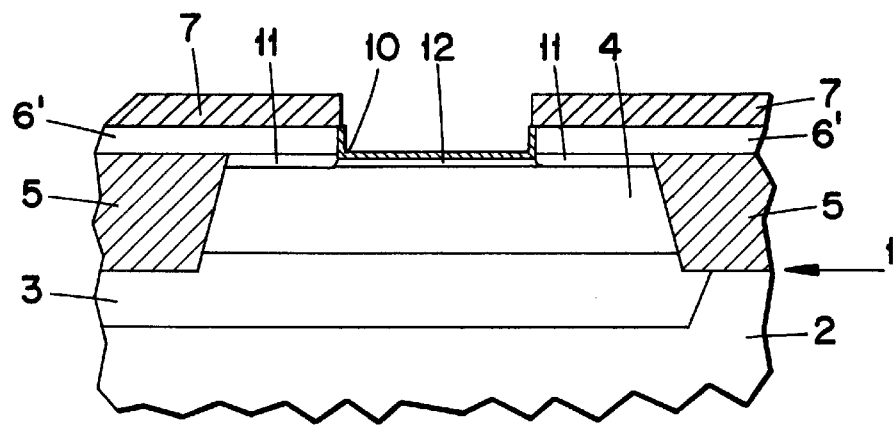
FIGS. 3–6 are cross-sectional views illustrating four inventive method steps in the fabrication of a bipolar transistor having a self-registered base-emitter structure departing from the structure illustrated in FIG. 2.

As shown in FIG. 3, there is then grown on the structure shown in FIG. 2 a thin thermal oxide layer 10 having a thickness of one or more tens of nanometers (FIG. 3) at a temperature which causes the amorphous silicon layer 6 to crystallize. This now crystalline silicon layer is referenced 6' in FIG. 3. A suitable temperature range in this regard is 700–1150° C. Parallel herewith, the dopants are driven into the substrate 1 from the doped, crystalline silicon layer 6' to form a doped area or region 11. A p-doped, intrinsic base 12 is formed by ion implantation of, e.g., $BF_2^+$ in the substrate 1 through the medium of the thin oxide layer 10. The p⁺-region 11 enables electric contact to be obtained between the intrinsic base 12 and the extrinsic base 6'.

Figure 4:
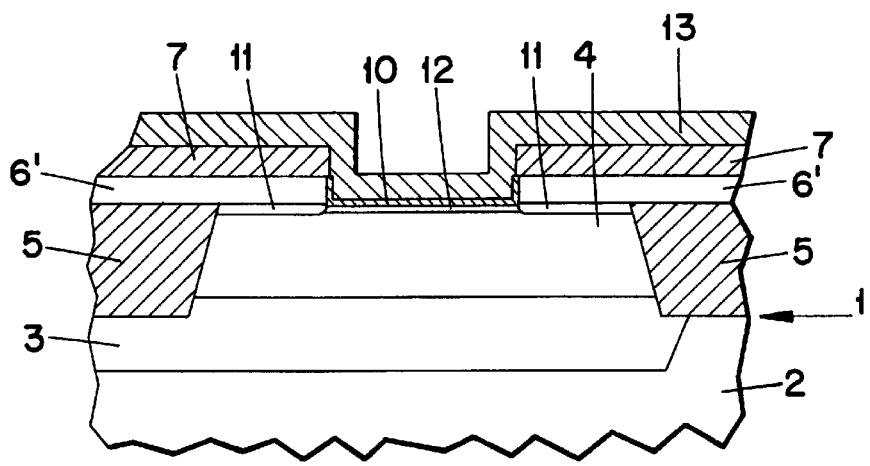

A layer 13 of electrically insulating material is then deposited conformly over the structure according to FIG. 3. The layer 13 will preferably have a thickness of some hundred nanometers and will preferably consist of a nitride, for instance silicon nitride $Si_3N_4$, and be deposited with the aid of LPCVD technique (Low Pressure Chemical Vapor Deposition). The resultant structure is shown in FIG. 4.

Figure 5:
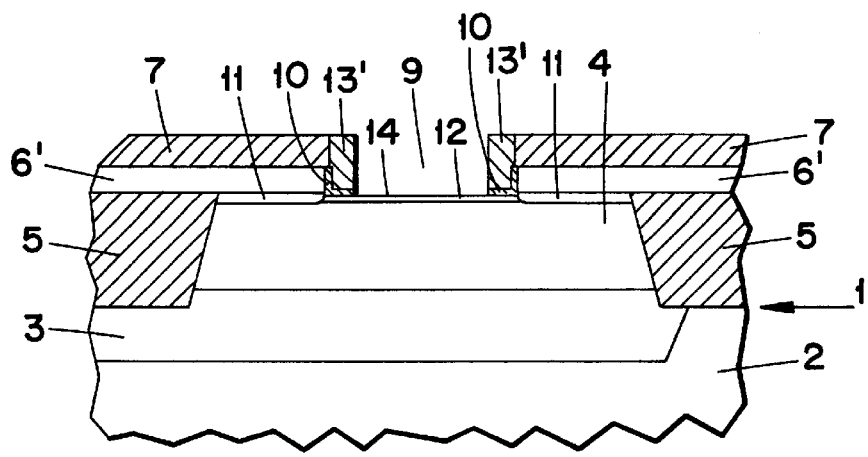

The nitride layer 13 is re-etched anisotropically in a plasma etching process until a thin oxide layer (not shown) remains on top of the substrate 1 in the emitter opening 9. A nitride string or so-called nitride spacer 13' remains along the side walls of the emitter opening 9. This oxide layer (not shown) is then removed by a selective plasma etching process or a wet etching process, therewith exposing the substrate surface 14 in the emitter opening 9. The resultant structure is shown in FIG. 5. This structure is then dipped, optionally in an HF bath or in HF vapour, to remove surface oxide, whereafter an emitter layer (not shown) of polycrystalline or amorphous silicon is deposited on the structure shown in FIG. 5. The emitter layer is deposited preferably to a thickness of some hundred nanometers and is n⁺-doped by implanting arsenic, for instance. The structure is then heat-treated, wherein the dopant (arsenic) is driven into the substrate 1 and forms an n⁺-doped region 16. During the heat-treatment-process, boron diffuses down in the substrate, wherewith the intrinsic base and the p⁺-doped region become deeper, as evident from the regions referenced 12' and 11' respectively in FIG. 6. A very shallow emitter (n⁺)-base(p)-junction can be obtained by carrying out the method steps with precision and by carefully controlling the steps. The emitter layer (not shown) is patterned lithographically and plasma etched in a conventional manner to define an emitter 15 in the emitter opening 9, as shown in FIG. 6.

Alternatively, the emitter 15 can be grown epitaxially and doped at the same time as it is grown. No patterning or etching of the emitter is necessary when using selective epitaxy. The spacer 13' isolates the extrinsic base 6' electrically from the emitter 15 in both of these cases.

Figure 6:
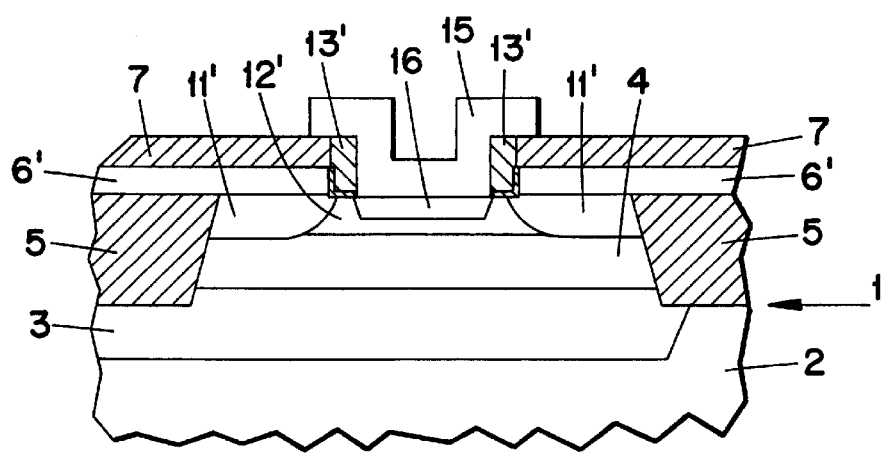

A further oxide layer is then optionally deposited on the structure shown in FIG. 6, whereafter the structure is patterned and etched to form contact holes.

it will be understood that the aforedescribed method can also be used in the fabrication of pnp-transistors, after changing the dopants. In this regard, the amorphous silicon layer 6 and the intrinsic base 12 are preferably doped with $BH_3$ or $AsH_3$, whereas the collector 3, 4 and the emitter 15, 16 are doped with $BF_3$.

The advantages that are afforded by a method of the aforedescribed kind include greater precision in manufacture, the possibility of reducing dimensions, meaning lower base-collector capacitance and lower base resistance of the transistor, and the avoidance of the risk of poor or no electrical contact between intrinsic and extrinsic bases, by virtue of the fact that it is unnecessary to etch out the emitter opening with a powerful over-etching procedure.

It will be understood that the aforedescribed embodiments of the inventive method can also be implemented with other semiconductor materials than silicon. For instance, an amorphous germanium layer can be etched from a crystalline layer of the same material, i.e. germanium, while retaining the aforedescribed advantages.

What is claimed is:

1. A selective etching method in the fabrication of a semiconductor device, comprising the steps of:

depositing an amorphous layer of semiconductor material on a monocrystalline substrate of the same semiconductor material;

depositing at least one dielectric layer on the amorphous layer such as to prevent crystallization of said amorphous layer;

patterning the resultant structure and thereafter etching away the dielectric layer and the amorphous semiconductor layer within a predetermined area or region; and heat-treating the resulting structure.

2. A method according to claim 1, wherein the amorphous layer is deposited to a thickness of some hundred nanometers.

3. A method according to claim 1, wherein the dielectric layer is deposited by plasma enhanced chemical vapor deposition, sub atmospheric chemical vapor deposition, molecular beam epitaxy or a spin-on technique.

4. A method according to claim 1, wherein the dielectric layer is deposited by plasma enhanced chemical vapor deposition with TEOS.

5. A method according to claim 1, wherein the amorphous layer is deposited on the substrate by a chemical vapor deposition technique.

6. A method according to claim 1, wherein the dielectric layer is deposited at a temperature of between 250 and 400° C.

7. A method according to claim 1, wherein the semiconductor material is silicon.

* * * * *